United States Patent [19]
Campbell

[11] Patent Number: 4,481,484
[45] Date of Patent: Nov. 6, 1984

[54] CONTROL CIRCUIT FOR LOW NOISE FREQUENCY AGILE OSCILLATOR

[75] Inventor: Richard A. Campbell, Concord, Mass.

[73] Assignee: Raytheon Company, Lexington, Mass.

[21] Appl. No.: 371,146

[22] Filed: Apr. 23, 1982

[51] Int. Cl.³ ............................................. H03L 7/00
[52] U.S. Cl. .................... 331/12; 331/1 R; 331/11; 331/15; 343/5 AF
[58] Field of Search ............ 331/11, 12, 15, 16, 331/1 R, 9; 455/76, 119, 125; 343/5 AF, 5 NQ

[56] References Cited
U.S. PATENT DOCUMENTS

| | | | |
|---|---|---|---|
| 3,287,656 | 11/1966 | Fleming | 331/1 R X |
| 3,992,679 | 11/1976 | Isono | 331/1 R |
| 4,032,858 | 6/1977 | Hargis | 331/9 |
| 4,048,580 | 9/1977 | Campbell et al. | 331/1 R |
| 4,336,505 | 6/1982 | Meyer | 331/1 R |

Primary Examiner—Eugene R. LaRoche
Assistant Examiner—W. R. Paxman
Attorney, Agent, or Firm—Philip J. McFarland; Joseph D. Pannone

[57] ABSTRACT

In a control circuit for a voltage-controlled oscillator including the combination of: (a) a source of D.C. power, the voltage out of such source being adjustable in discrete steps to provide a coarse frequency control signal; (b) a control loop, responsive to the signal out of the voltage-controlled oscillator, to provide a fine frequency control signal; and (c) a summer to combine the coarse and fine frequency control signals into a single frequency control signal for the voltage-controlled oscillator, an improvement is shown wherein the control loop comprises an interferometer wherein noise extant on the signal out of the voltage-controlled oscillator is degenerated by dividing a portion of such signal into a reference path, a delayed path and a parallel path, the signals in the latter two paths being processed to produce an amplitude corrected signal for combination with the signal, shifted by 90°, in the reference path, finally to produce the fine frequency control signal.

4 Claims, 1 Drawing Figure

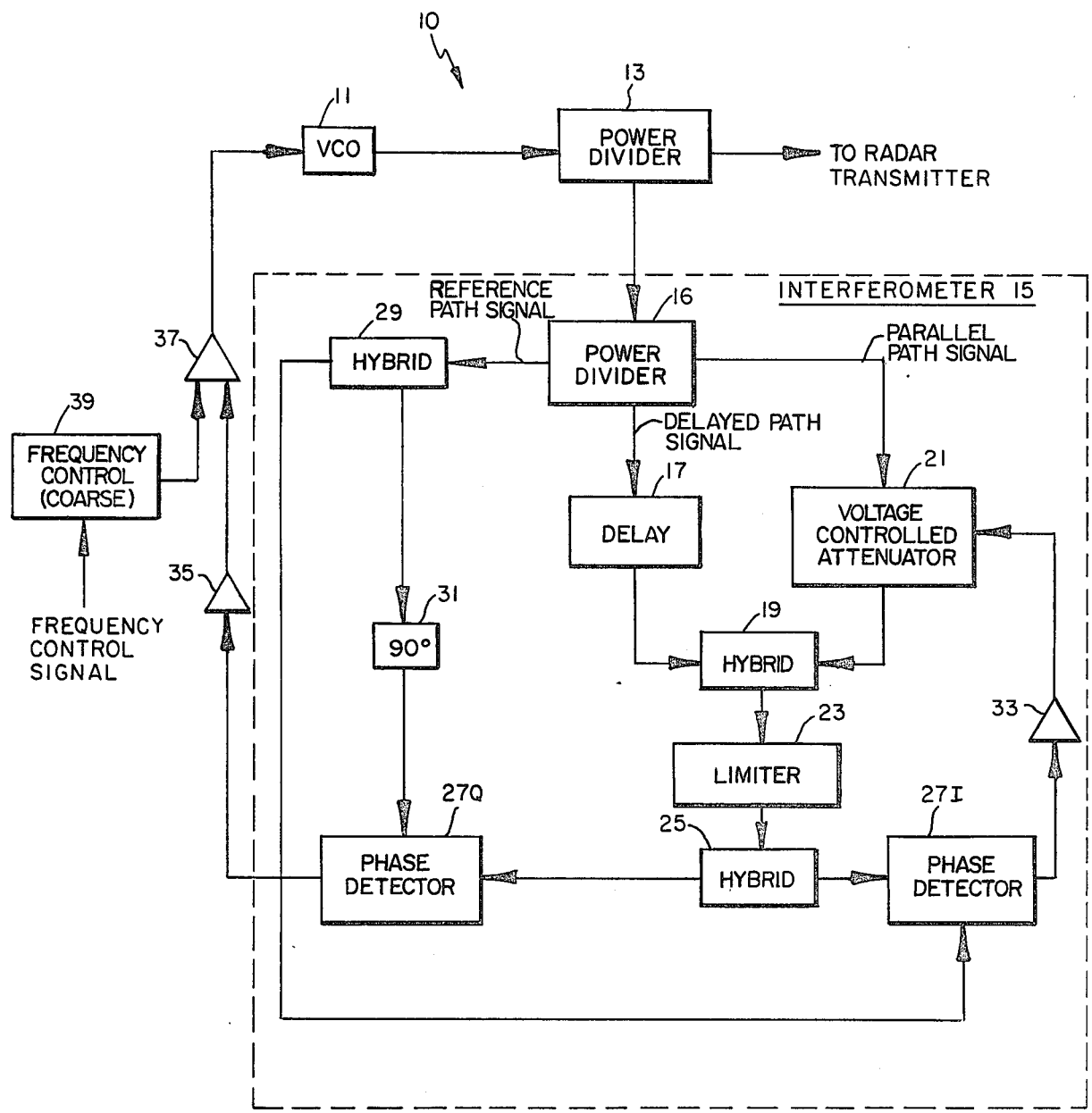

CONTROL CIRCUIT FOR LOW NOISE FREQUENCY AGILE OSCILLATOR

BACKGROUND OF THE INVENTION

This invention pertains generally to radio frequency oscillators, and, more particularly, to a low noise, frequency-agile microwave oscillator.

Modern day air defense radars require the use of microwave sources with extremely low noise to counter the threat of stealth aircraft or to achieve better moving target indicator (MTI) performance. Further, to operate satisfactorily in the presence of electronic countermeasure (ECM), or to control a multiplicity of surface-to-air missiles, such radars must be frequency-agile.

In the past, very low noise and frequency agility could not be attained contemporaneously. Thus, known microwave sources achieving very low noise operation do so through the use of a cavity discriminator, while known microwave sources achieving frequency agility do so through the use of an interferometer-controlled feedback loop to degenerate phase noise. Therefore, with known design techniques, it is necessary in each application to make a "trade-off" between noise and frequency agility.

There are several secondary problems associated with the use of a cavity that complicate its use as a noise degeneration mechanism for a microwave source. The first such problem is the bandwidth of the cavity: If the bandwidth of the cavity is too wide, then sensitivity is reduced, but if the bandwidth is too narrow, then stability is affected. The bandwidth of any cavity is determined by the "Q" of the cavity, a parameter that is a function of geometry, surface finish, and other mechanical considerations, so fabrication of a satisfactory cavity for the purpose is difficult. Further, there is also a problem of microphonics that may be encountered in the use of any cavity.

SUMMARY OF THE INVENTION

With the foregoing background of the invention in mind, it is a primary object of this invention to provide a microwave source having both frequency agility and noise performance comparable to a cavity discriminator.

It is another object of this invention to provide a low noise, frequency agile, microwave source wherein the bandwidth may be accurately controlled.

The foregoing and other objects of this invention are attained generally by providing a microwave source wherein an interferometer is utilized as a discriminator. The contemplated microwave source comprises a voltage-controlled oscillator, the output signal from which is divided to provide an output signal to be amplified and transmitted and an input signal to the interferometer wherein further division of the signal into three paths (a delayed path, a parallel path and a reference path) is effected. The delayed path has a delay chosen to provide a specified bandwidth and the parallel path includes a voltage-controlled attenuator. The output signals from the delayed and parallel paths are combined and passed, via a limiter, to a hybrid, and thence to a pair of phase detectors. The signal in the reference path is divided in a hybrid to provide a pair of signals, one being applied as an "in-phase" reference signal to a first one of the phase detectors to produce an amplitude error signal, and the second, after being phase shifted by 90°, being applied as a "quadrature" reference signal to the second phase detector to produce a phase error signal. The amplitude error signal is passed, via an amplifier, ultimately to the voltage-controlled attenuator, while the phase error signal is passed, via an amplifier, to the voltage-controlled oscillator. Ultimately, then, the contemplated arrangement is effective to operate as a carrier-nulling discriminator that is effective to stabilize the operating frequency of the voltage-controlled oscillator and to reduce noise to a minimum. To effect a frequency change, a separate D.C. control signal is applied to the voltage-controlled oscillator.

BRIEF DESCRIPTION OF THE DRAWING

For a more complete understanding of the invention, reference is now made to the following description of the accompanying drawing, in which the single FIGURE is a simplified block diagram of a microwave source employing an interferometer according to this invention.

DESCRIPTION OF THE PREFERRED EMBODIMENT

Referring now to the single FIGURE, a low noise, frequency-agile microwave source 10 is shown to include a voltage-controlled oscillator (VCO 11) having its output signal split in a power divider 13, with a first portion thereof being passed to a radar transmitter (not shown) and a second portion being passed to an interferometer 15. Within such interferometer the second portion is split in a three-way power divider 16 to form signals designated as a reference path signal, a delayed path signal and a parallel path signal. The delayed path signal is passed, via a delay network 17 (which here may simply comprise a surface acoustic wave (SAW) delay line or a simple coaxial cable), to a hybrid 19 wherein it is combined with the parallel path signal after passage through a voltage-controlled attenuator 21. The output signal from the hybrid 19 is applied to a limiter 23 (which is provided to protect the circuitry when a null condition does not exist). The signal out of the limiter 23 is split in a hybrid 25 to provide an input signal to an "in-phase" phase detector 27I and a "quadrature" phase detector 27Q. The second (or reference) signal to the "in-phase" phase detector 27I is obtained from a hybrid 29, supplied by the reference path signal, while the second (or reference) signal to phase detector 27Q is obtained from the hybrid 29, via a 90° phase shifter 31.

A moment's thought now should make it apparent that a carrier null can only be achieved when the two input signals to the hybrid 19 are equal in magnitude and of opposite phase (180° out-of-phase). To attain such conditions, the output frequency of the VCO 11 is tuned to a specific frequency so that ultimately phase-opposed signals are applied to the hybrid 19. The relative amplitudes of the signals applied to the hybrid 19 then are controlled by the voltage-controlled attenuator 11. With "in phase" signals applied, the signal out of the phase detector 27I is indicative only of amplitude modulation so that when such signal is passed as a control signal, via an amplifier 33, to the voltage-controlled attenuator 21, the input signals to the hybrid 19 are ultimately forced to be of equal amplitude. With the phase of the input signals to phase detector 27Q controlled in such a manner that a quadrature relation exists, the signal out of phase detector 27Q is an indication of the phase error existing between the signals out of hybrids 19 and 29, and, when passed, via a loop-shaping amplifier 35 and a summing amplifier 37, is a fine frequency control signal for the VCO 11. It should now be appreciated by those of skill in the art that, because the input signals to phase detector 27Q are in phase quadrature, that device will demodulate phase-modulated (PM) sidebands appearing on the output signal from hybrid 19. It should also be noted here that because there is little carrier signal left at the output of the limiter 23 when a null is achieved, the carrier into the phase detectors 27I, 27Q is that supplied by the hybrid 29 in the reference path. Thus, the effective degree of carrier-nulling gain (i.e., the improvement over a conventional interferometer) is the ratio of the signal power into hybrid 19 to the reference power into the phase detectors 27I, 27Q.

The 180° difference in phase between the signals applied to hybrid 19 may be achieved at intervals equal to 1/T (where T is the delay time of the delay network 17). When the VCO 11 is initially activated, in all probability a 180° difference in phase between the signals applied to the hybrid 19 will not be produced. The limiter 23 is, however, then operative to limit the signals applied to the phase detectors 27I, 27Q. At the same time discriminator action, but at reduced gain (by the amount of the limiting), is experienced. Such discriminator action forces the frequency of the VCO 11 toward a frequency, i.e. a "stable" frequency. As the stable frequency is approached, the carrier level from hybrid 19 will get smaller until finally the limiter 23 ceases to operate and the full gain is available.

It will be appreciated by those of skill in the art that the time constants of the loop (not numbered) controlling the VCO 11 and the loop (also not numbered) controlling the voltage-controlled attenuator 21 must be arranged so that the former is much faster in operation than the latter. That is to say, the described interferometer 15 operates by first tuning the VCO 11 to the correct frequency (the one at which the delay network 17 causes the input signals to the hybrid 19 to be 180° out-of-phase) and then adjusting the voltage-controlled attenuator 21 to control the carrier-nulling amplitude thereby to obtain the best possible null. Once the VCO 11 is tuned to a stable frequency, the full gain of the carrier-nulling interferometer is available and the PM noise detected in phase detector 27Q is fed back to the VCO 11 to degenerate or reduce this PM noise.

Frequency agility of the microwave source 10 is achieved simply by changing the frequency of the VCO 11 faster than the loop controlling that VCO can follow. To this end, in response to an externally applied FREQUENCY COMMAND to a frequency control network 39, that unit will apply a step function to the VCO 11, via the summing amplifier 37, to cause the VCO 11 to step in frequency. After the frequency step the interferometer 15 will again be operative to tune the frequency of the VCO 11 to the nearest stable frequency. As mentioned briefly hereinabove, an interferometer is generally periodic in its response versus frequency, and, therefore, stable operation can be achieved at intervals equal to 1/T, where T is the time delay provided by the delay network 17. Thus, the frequency control network 39 will cause the VCO 11 to be stepped in frequency by an amount corresponding to an integer multiple of 1/T. The interferometer 15 thus provides the low noise performance of a discriminator as well as the frequency agility made possible by the periodicity of the interferometer. Finally, it should be noted here that parameters such as, for example, overall loop gain and loop bandwidth, although they are important to achieving a properly operating feedback loop, are felt to be matters involving ordinary skill in the art and they are therefore not recounted here.

Having described a preferred embodiment of this invention, it will be apparent to one of skill in the art that many changes and modifications may be made without departing from the inventive concept of utilizing an interferometer as a discriminator to achieve both low noise and frequency agility. It is felt, therefore, that coverage should not be limited to the disclosed embodiments, but rather should be limited only by the spirit and scope of the appended claims.

What is claimed is:

1. A control ciruit for a voltage-controlled oscillator, such circuit comprising:
    (a) means receiving the output signal of the voltage-controlled oscillator, for deriving from said output signal an output representative signal;
    (b) means for equally splitting the output representative signal to form a first, second and third signal in corresponding first, second and third paths;
    (c) delay means and variable attenuating means disposed, respectively, in the first and the second path;
    (d) means for vectorially subtracting the delayed first and the attenuated second signals in the first and the second paths to form a fourth signal having an amplitude and phase, relative to the output signal of the voltage-controlled oscillator, indicative of the instantaneous frequency of said output signal;
    (e) means for dividing the third signal into a reference signal and a phase-shifted reference signal in quadrature with the reference signal;
    (f) first phase detector means responsive to the phase shifted reference signal and to the fourth signal, and second phase detector means responsive to the reference signal and to the fourth signal, said first phase detector means providing an error signal to control the frequency of the voltage-controlled oscillator and said second phase detector means providing an attenuator control signal to control the fourth signal, thereby ultimately to stabilize the frequency of the output signal of the voltage-controlled oscillator.

2. The controll circuit as in claim 1 having, additionally, limiter means disposed in the path of the fourth signal.

3. The control circuit as in claim 2 having, additionally means for changing in discrete steps a voltage applied with said error signal to the voltage-controlled oscillator to attain frequency agility, the frequency before and after changing being proportional to an integer multiple of 1/T, where T is the time delay of the delay means.

4. The control circuit as in claim 3 wherein the time constant of the circuit containing the first phase detector is less than the time constant of the circuit containing the second phase detector.

* * * * *